(12) United States Patent
Fukushima

(10) Patent No.: US 12,046,396 B2
(45) Date of Patent: Jul. 23, 2024

(54) WIRING MEMBER

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventor: Daichi Fukushima, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 229 days.

(21) Appl. No.: 17/629,620

(22) PCT Filed: Jul. 15, 2020

(86) PCT No.: PCT/JP2020/027493
§ 371 (c)(1),
(2) Date: Jan. 24, 2022

(87) PCT Pub. No.: WO2021/020129
PCT Pub. Date: Feb. 4, 2021

(65) Prior Publication Data
US 2022/0246323 A1 Aug. 4, 2022

(30) Foreign Application Priority Data
Aug. 1, 2019 (JP) .................................. 2019-141911

(51) Int. Cl.
H01B 7/42 (2006.01)
H01B 7/08 (2006.01)
H01B 7/40 (2006.01)

(52) U.S. Cl.
CPC ............. *H01B 7/0846* (2013.01); *H01B 7/40* (2013.01); *H01B 7/42* (2013.01)

(58) Field of Classification Search
CPC ................................ H01B 7/0846; H01B 7/42
See application file for complete search history.

(56) References Cited

U.S. PATENT DOCUMENTS 9,531,173 B2 * 12/2016 Masuda ............... H02G 3/0468
10,766,438 B2    9/2020 Mizuno et al.
(Continued)

FOREIGN PATENT DOCUMENTS

| CN | 106062889 | 10/2016 |
|----|-----------|---------|
| CN | 109906490 | 6/2019 |

(Continued)

OTHER PUBLICATIONS

Office Action, Japan Patent Office, in counterpart Japanese Patent Application No. 2019-141911, issued on Jan. 24, 2023, with English translation.
(Continued)

*Primary Examiner* — Sherman Ng
(74) *Attorney, Agent, or Firm* — GREENBLUM & BERNSTEIN, P.L.C.

(57) ABSTRACT

A wiring member includes: a base member; a transmission wire body; and a wire-like transmission member having a covering provided around the transmission wire body, wherein the wire-like transmission member includes a fixing region fixed to the base member and a separating region separated from the base member, and a thermal conductive layer having more favorable thermal conductivity than the covering is formed on an outer periphery of the covering in the separating region.

8 Claims, 4 Drawing Sheets

(56) References Cited

U.S. PATENT DOCUMENTS

| | | | | |
|---|---|---|---|---|
| 2013/0256029 A1* | 10/2013 | Toyama | ............... | H02G 3/0462 174/72 A |
| 2016/0268019 A1 | 9/2016 | Kanagawa | | |
| 2019/0287696 A1 | 9/2019 | Mizuno et al. | | |
| 2019/0392963 A1 | 12/2019 | Ishida et al. | | |
| 2020/0172027 A1 | 6/2020 | Mizuno et al. | | |

FOREIGN PATENT DOCUMENTS

| | | |
|---|---|---|
| JP | 2018-32687 | 3/2018 |
| JP | 2018-107250 | 7/2018 |
| JP | 2018-137208 | 8/2018 |
| JP | 6365704 | 8/2018 |
| JP | 2019-003925 | 1/2019 |
| WO | 2018/155166 | 8/2018 |

OTHER PUBLICATIONS

International Search Report, Patent Application No. PCT/JP2020/027493, issued Aug. 11, 2020, with English translation.
Written Opinion of the International Searching Authority, Patent Application No. PCT/JP2020/027493, issued Aug. 11, 2020, with English translation.
International Preliminary Report on Patentability, Patent Application No. PCT/JP2020/027493, issued Feb. 1, 2022, with English translation.
China Office Action received in CN Application No. 202080052315.4, dated Aug. 15, 2023.

\* cited by examiner

WIRING MEMBER

TECHNICAL FIELD

The present disclosure relates to a wiring member.

BACKGROUND ART

Patent Document 1 discloses a wire harness including a sheet-like member 30, an electrical wire, and a holding part. The holding part is a part at least partially intervening between the electrical wire and the sheet-like member 30 and fixing the electrical wire to the sheet-like member 30 in a state of being welded to the sheet-like member 30 by ultrasonic welding or laser welding.

PRIOR ART DOCUMENTS

Patent Documents

Patent Document 1: Japanese Patent Application Laid-Open No. 2019-003925

SUMMARY

Problem to be Solved by the Invention

In Patent Document 1, the electrical wire may include a part not fixed to the sheet-like member 30. Improvement of heat radiation property in this part is desired.

An object of the present disclosure is to improve a heat radiation property of a part of a wire-like transmission member not fixed to the base member in a wiring member including the base member and the wire-like transmission member fixed to the base member.

Means to Solve the Problem

A wiring member according to the present disclosure includes: a base member; a transmission wire body; and a wire-like transmission member having a covering provided around the transmission wire body, wherein the wire-like transmission member includes a fixing region fixed to the base member and a separating region separated from the base member, and a thermal conductive layer having more favorable thermal conductivity than the covering is formed on an outer periphery of the covering in the separating region.

Effects of the Invention

According to the present disclosure, improved is a heat radiation property of a part of a wire-like transmission member not fixed to the base member in a wiring member including the base member and the wire-like transmission member fixed to the base member.

DESCRIPTION OF EMBODIMENT(S)

Description of Embodiment of Present Disclosure

Embodiments of the present disclosure are listed and described firstly.

A wiring member according to the present disclosure is as follows.

(1) A wiring member includes: a base member; and a wire-like transmission member having a transmission wire body and a covering provided around the transmission wire body, wherein the wire-like transmission member includes a fixing region fixed to the base member and a separating region separated from the base member, and a thermal conductive layer having more favorable thermal conductivity than the covering is formed on an outer periphery of the covering in the separating region. Heat generated in the separating region in the wire-like transmission member extends along the thermal conductive layer. Thus, improved is a heat radiation property of a part of a wire-like transmission member not fixed to the base member in a wiring member including the base member and the wire-like transmission member fixed to the base member.

(2) The thermal conductive layer may be formed in a region reaching the base member from the separating region. In this case, heat generated in the separating region is transmitted to the base member along the thermal conductive layer.

(3) The thermal conductive layer may be formed in an area except for at least a part of an outer periphery of the covering in the fixing region. In this case, the thermal conductive layer needs not be formed in the whole periphery of the covering, thus cost reduction can be achieved.

(4) The thermal conductive layer may be a resin layer including a thermal conductive filler or a metal layer. In this case, heat is transmitted along the resin layer including the thermal conductive filler or the metal layer.

(5) The base member may include a metal layer. In this case, heat generated in the fixing region in the wire-like transmission member extends effectively to the metal layer of the base member.

(6) The wire-like transmission member may be fixed to the base member by a thermal conductive material having more favorable thermal conductivity than the covering in the fixing region. In this case, heat generated in the fixing region in the wire-like transmission member extends to the base member along the thermal conductive material.

Details of Embodiment of Present Disclosure

Specific examples of a wiring member of the present disclosure are described hereinafter with reference to the drawings. The present disclosure is not limited to these examples, but is indicated by claims, and it is intended that meanings equivalent to claims and all modifications within a scope of claims are included.

Embodiment

Figure 1:
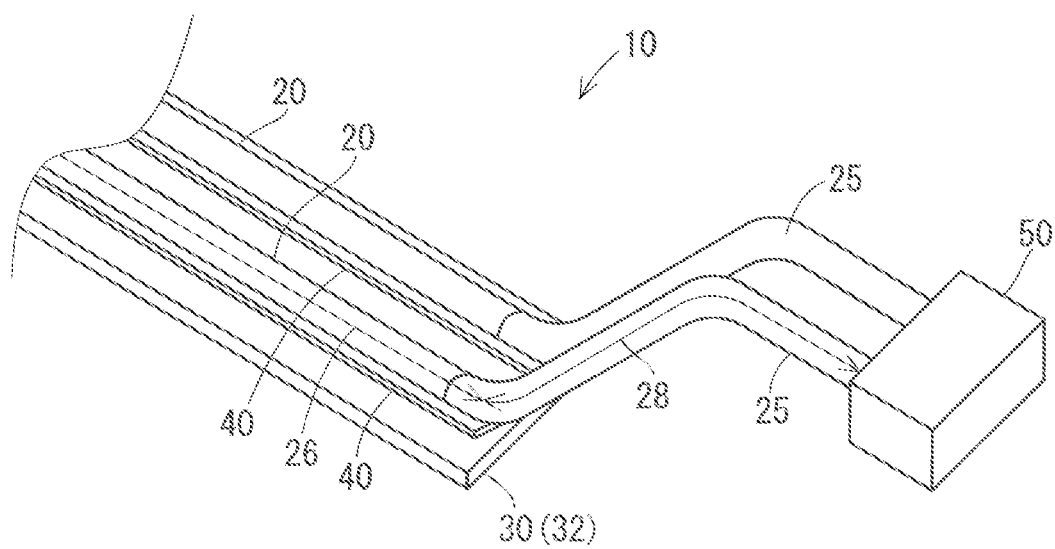
FIG. 1 is a perspective view illustrating a wiring member according to an embodiment.
Figure 2:
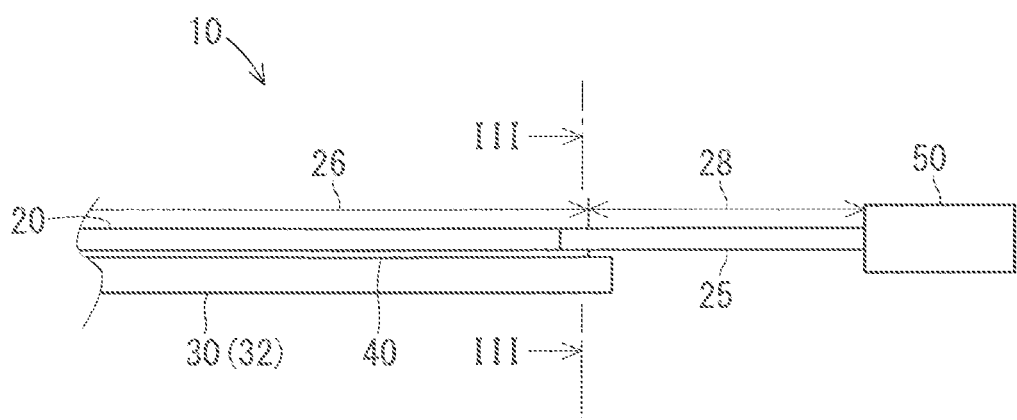
FIG. 2 is a side view illustrating the wiring member.
Figure 3:
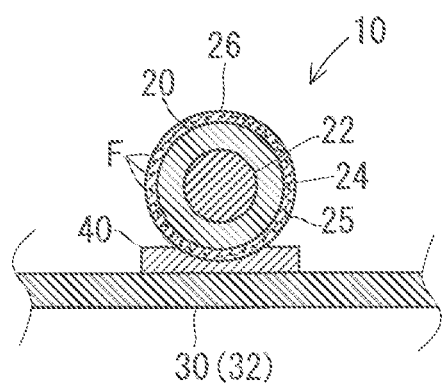
FIG. 3 is a III-III line cross-sectional view in FIG. 2.

A wiring member according to an embodiment is described hereinafter. FIG. 1 is a perspective view illustrating a wiring member 10. FIG. 2 is a side view illustrating the wiring member 10. FIG. 3 is across-sectional view along a III-III line in FIG. 2.

The wiring member 10 includes a base member 30 and a wire-like transmission member 20. The wiring member 10 is mounted to a vehicle, for example. The wiring member 10 is used as a wiring connecting electrical components in the vehicle, for example.

The wire-like transmission member 20 includes a transmission wire body 22 and a covering 24. The transmission wire body 22 is a wire-like body transmitting an electrical power. The covering 24 is provided around the transmission wire body 22. An outermost layer of the covering 24 is a resin layer.

For example, the wire-like transmission member 20 may be an electrical wire. The electrical wire includes a core wire as the transmission wire body 22 and an insulation layer as the covering 24. The core wire is a wire-like conductor formed by a metal conductive member, for example. The insulation layer is an insulating part covering around the core wire. For example, the wire-like transmission member 20 may be a shielded wire, a twisted wire, or an enamel wire in addition to the electrical wire.

The base member 30 is a member having a main surface to which the wire-like transmission member 20 described above is fixed. The base member 30 is a sheet-like member which can be bended, for example. The base member 30 may be a plate-like member having rigidity with a degree of being able to keep a constant shape. The base member 30 may have a planar shape or a shape having a portion bended in a thickness direction. In the description herein, the base member 30 is the sheet-like member 30.

The wire-like transmission member 20 includes a fixing region 26 and a separating region 28 in regions different from each other in an extension direction thereof. The fixing region 26 is a region fixed to the sheet-like member 30. The separating region 28 is a region separated from the sheet-like member 30. In other words, the fixing region 26 and the separating region 28 are set in regions different from each other in a longitudinal direction of the wire-like transmission member 20.

Herein, the sheet-like member 30 is formed into an elongated quadrangular shape. An intermediate portion of the wire-like transmission member 20 in an extension direction is fixed to the sheet-like member 30. Herein, the intermediate portion of the plurality of (herein, two) wire-like transmission members 20 in the extension direction is fixed to one main surface of the sheet-like member 30 in a parallel posture at interval. In this manner, the region of the wire-like transmission member 20 fixed to one main surface of the sheet-like member 30 is the fixing region.

At least one end portion of the wire-like transmission member 20 extends from an end portion of the sheet-like member 30 to an outer side. A part of the wire-like transmission member 20 extending from the end portion of the sheet-like member 30 to the outer side is the separating region 28. A connector 50 is connected to the end portion of the wire-like transmission member 20. The end portion of the wire-like transmission member 20 is separated from the sheet-like member 30 and guided toward an apparatus to which the connector 50 is connected. The connector 50 is connected to a connector on a side of the apparatus. For example, the separating region 28 is provided to connect the connector 50 on the end portion of the wire-like transmission member 20 separated from the sheet-like member 30 to the other apparatus.

The separating region 28 of the wire-like transmission member 20 needs not be a region coming out of the sheet-like member 30. For example, there may be a case where a region on a side of the end portion of the wire-like transmission member 20 is not fixed to the sheet-like member 30 also in an inner region of the end portion of the sheet-like member 30, but is disposed to be separated from the main surface of the sheet-like member 30 to be guided toward the other position. Even in such a case, the region on the side of the end portion of the wire-like transmission member 20 is the separating region. FIG. 1 also exemplifies the wire-like transmission member 20 separated from the sheet-like member 30 slightly in front of an edge of the end portion of the sheet-like member 30.

A configuration of fixing the wire-like transmission member 20 to the sheet-like member 30 is not particularly limited. A fixing state of the sheet-like member 30 and the wire-like transmission member 20 may be a contact area fixation or a non-contact area fixation, or both fixations may be used together. Herein, the contact area fixation indicates that a portion where the wire-like transmission member 20 and the sheet-like member 30 have contact with each other is stuck and fixed. The non-contact area fixation indicates the fixing state which is not the contact area fixation. The non-contact area fixation may have a configuration that, for example, a sewing thread, the other sheet-like member 30, or an adhesive tape presses the wire-like transmission member 20 toward the sheet-like member 30. The non-contact area fixation may have a configuration that, for example, a sewing thread, the other sheet-like member 30, or an adhesive tape surrounds and sandwiches the wire-like transmission member 20 and the sheet-like member 30 to keep them in a fixing state. In the description hereinafter, the wire-like transmission member 20 and the sheet-like member 30 are in the state of the contact area fixation.

Applicable as the configuration of the contact area fixation are a contact area indirect fixation and a contact area direct fixation, or both fixations may also be used together in different regions. Herein, the contact area indirect fixation indicates that the wire-like transmission member 20 and the sheet-like member 30 are indirectly stuck and fixed via an intervening member such as an adhesive agent, a gluing agent, and a double-sided adhesive tape provided therebetween. The contact area direct fixation indicates that the wire-like transmission member 20 and the sheet-like member 30 are directly stuck and fixed without an intervention of the adhesive agent, for example, which is separately provided.

Considered in the contact area direct fixation is that resin included in at least one of the wire-like transmission member 20 and the sheet-like member 30 is melted, thus the wire-like transmission member 20 and the sheet-like member 30 are stuck and fixed, for example. In forming a state of the contact area direct fixation, the resin is considered to be melt by heat by, for example, ultrasonic welding, heating-pressurizing welding, hot air welding, and high frequency welding. The resin is also considered to be melt by a solvent, for example.

In the description herein, the wire-like transmission member 20 and the sheet-like member 30 are fixed to each other via an adhesive agent 40 provided therebetween. The adhesive agent 40 is formed along the whole fixing region 26 on the sheet-like member 30. That is to say, the wire-like transmission member 20 is fixed to the sheet-like member 30 on the whole fixing region 26 in the extension direction. The wire-like transmission member 20 may be fixed to the sheet-like member 30 partially in the fixing region 26 in the extension direction. For example, the wire-like transmission member 20 may be fixed to the sheet-like member 30 intermittently in the fixing region 26 in the extension direction. The adhesive agent 40 may extend on the whole main surface of the sheet-like member 30.

The wire-like transmission member 20 may be wired in a state following a route in a vehicle on the sheet-like member 30. For example, the plurality of wire-like transmission members 20 may also be bended and disposed on the sheet-like member 30. For example, the plurality of wire-like transmission members 20 may be branched in accordance with a position of each electrical component to which the wire-like transmission members 20 are connected. In this case, a branch part may be fixed on the sheet-like member 30. The plurality of wire-like transmission members 20 may also be stacked in layers on the sheet-like member 30. The plurality of wire-like transmission members 20 may intersect on the sheet-like member 30. In any case, the wire-like transmission member 20 is fixed on the sheet-like member 30, thus the wiring member 10 is a flat wiring member.

A thermal conductive layer 25 is formed on an outer periphery of the covering 24 in the separating region 28 in the wire-like transmission member 20. The thermal conductive layer 25 is a layer having more favorable thermal conductivity than the covering 24. The thermal conductivity may be evaluated by a thermal conductance rate, for example. The thermal conductive layer 25 may be wholly or partially formed around the covering 24 in the separating region 28 in a circumferential direction of the covering 24. Herein, the thermal conductive layer 25 is wholly formed around the covering 24 in the separating region 28. The thermal conductive layer 25 may be wholly or partially formed on the covering 24 in the separating region 28 in the extension direction of the separating region 28. For example, when the end portion of the wire-like transmission member 20 is introduced into the connector 50, the thermal conductive layer 25 may be omitted at the end portion of the wire-like transmission member 20.

The thermal conductive layer 25 may be a resin layer including a thermal conductive filler F, for example. The thermal conductive layer 25 may include epoxy resin, silicone, modified silicone, acrylic resin, or cyanoacrylate series resin as a main component, for example. The thermal conductive filler F is a member having higher thermal conductivity than the covering 24. The thermal conductive filler F may include an inorganic filler or a metal filler. Applicable as a material of the inorganic filler is silica, aluminum oxide, magnesium oxide, beryllium oxide, boron nitride, aluminum nitride, silicon nitride, silicon carbide, boron carbide, titanium carbide, mullite, graphite, and carbon nanotube, for example. Copper, aluminum, silver, and iron is applicable as a material of the metal filler.

The thermal conductive layer 25 can be formed by applying a thermal conductive adhesive agent in a fluid state around the covering 24 and then hardening it, for example.

Figure 4:
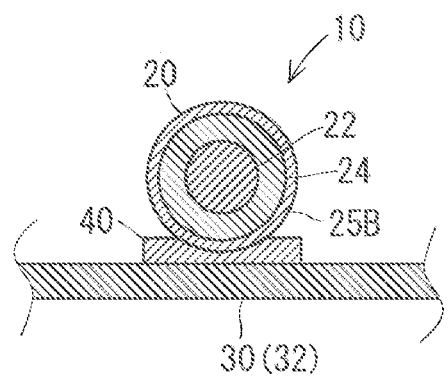
FIG. 4 is a cross-sectional view illustrating a wiring member according to a modification example.

As illustrated in FIG. 4, a thermal conductive layer 25B corresponding to the thermal conductive layer 25 may be a metal layer of chrome, nickel, copper, or gold, for example. In this case, the thermal conductive layer 25B may be formed by performing plate processing around the covering 24.

The thermal conductive layer 25 may be formed in a region reaching the base member 30 from the separating region 28. More specifically, the thermal conductive layer 25 may be formed in a region reaching the fixing region 26 on the base member 30 from the separating region 28. In this case, the thermal conductive layer 25 is fixed to the base member 30 in at least a part of the fixing region 26. Herein, the thermal conductive layer 25 is fixed to the base member 30 via the adhesive agent 40 in at least a part of the fixing region 26. The thermal conductive layer 25 needs not reach the base member 30 from the separating region 28.

The thermal conductive layer 25 may be formed in an area except for at least a part of the outer periphery of the covering 24 in the fixing region 26. Herein, the thermal conductive layer 25 is formed in a region ranging from the separating region 28 to an end portion of the fixing region 26 on a side of the separating region 28. The thermal conductive layer 25 may not be formed in an intermediate portion of the fixing region 26 in the extension direction and the end portion thereof on a side opposite to the separating region 28.

According to the wiring member 10, heat generated in the separating region 28 in the wire-like transmission member 20 extends to the whole surface of the thermal conductive layer 25 along the thermal conductive layer 25. For example, even when heat is partially generated in the separating region 28 in the extension direction, the heat extends to the whole surface of the thermal conductive layer 25 and is efficiently diffused. Thus, in the wiring member 10 including the sheet-like member 30 and the wire-like transmission member 20, the heat radiation property of the part of the wire-like transmission member 20 which is not fixed to the sheet-like member 30 is improved, and heat accumulation in the separating region 28 is suppressed.

The heat generated in the fixing region 26 in the wire-like transmission member 20 is expected to be transmitted to the base member 30. Accordingly, heat accumulation in the fixing region 26 is suppressed.

The thermal conductive layer 25 described above may be formed in a region reaching the sheet-like member 30 from the separating region 28. In this case, heat generated in the separating region 28 is transmitted to the base member 30 via the thermal conductive layer 25. Thus, heat accumulation in the separating region 28 is further suppressed.

The thermal conductive layer 25 described above may be formed in an area except for at least a part of the outer periphery of the covering 24 in the fixing region 26. In this case, a region where the thermal conductive layer 25 is formed is reduced, thus a material cost and a processing cost can be reduced. This configuration also contributes to weight saving of the wiring member 10.

The thermal conductive layer 25 may also be a resin layer including the thermal conductive filler F or a metal layer. Accordingly, heat generated in the separating region 28 is easily transmitted to the resin layer including the thermal conductive filler F or the thermal conductive layer 25 which is the metal layer.

The heat in the fixing region 26 can be transmitted to the sheet-like member 30. The heat in the separating region 28 can be transmitted to the sheet-like member 30 via the thermal conductive layer 25. In these cases, the heat transmitted to the sheet-like member 30 may be transmitted to the whole sheet-like member 30. Thus, the sheet-like member 30 preferably includes the metal layer. The metal layer 32 may be provided in the sheet-like member 30 on a side where the wire-like transmission member 20 is fixed. The sheet-like member 30 may have a single layer structure including only the metal layer 32. The sheet-like member 30 may have a multilayer structure in which the other layer is stacked on the metal layer 32. The layer stacked on the metal layer 32 may be a metal layer made up of metal different from that of the metal layer 32 as a material, or may also be a resin layer. FIG. 1 to FIG. 4 illustrate a case where the whole sheet-like member 30 is a metal layer.

Various configurations can be adopted as the configuration of fixing a part of the wire-like transmission member 20 where the resin of the covering 24 is exposed to a part where the metal layer 32 is exposed on the sheet-like member 30.

For example, it is also applicable that the adhesive agent 40 contains a chemical compound including a resin side functional group and a metal side functional group in a molecular structure, the resin side functional group is chemically bonded to the resin constituting the covering 24 and the metal side functional group is chemically bonded to the metal constituting the metal layer 32 as with an adhesive agent including a silane coupling agent. For example, it is also applicable that the metal side functional group is an alkoxy group, and the chemical compound further include silicon bonding the alkoxy group and the resin side functional group in a molecular structure. The metal side functional group may be a chelate group. When the resin constituting the covering 24 is polyvinyl chloride, the resin side functional group may be one type or two or more types of functional group selected from a group made up of an amino group, a thiol group, and an epoxy group. When the resin constituting the covering 24 is polyolefin, the resin side functional group may be one type or two or more types of functional group selected from a group made up of an amino group, a thiol group, a vinyl group, an acrylic group, a methacryl group, and an epoxy group. The chemical compound may be a polymer in which the plurality of resin side functional groups and the plurality of inorganic material side functional groups are bonded to a molecular chain.

When the surface of the metal layer 32 has a concave-convex structure or a structure with a bole, an adhesive agent appropriate for bonding the resin of the covering 24 may be used as the adhesive agent 40. In this case, the adhesive agent 40 is expected to be bonded to the surface of the metal layer 32 by an anchor effect.

Various configurations can be adopted as the configuration of fixing a part of the wire-like transmission member 20 where the metal of the thermal conductive layer 25 is exposed to a part where the metal layer 32 is exposed on the sheet-like member 30. For example, an adhesive agent appropriate for bonding metals such as an epoxy series adhesive agent may be used. The thermal conductive layer 25 and the metal layer 32 may be fixed by solder, brazing, or welding, for example.

Alternatively, the wire-like transmission member 20 may be sewn by a sewing thread to the sheet-like member 30. The wire-like transmission member 20 may be covered by resin together with the sheet-like member 30 to be fixed to the sheet-like member 22. The wire-like transmission member 20 is sandwiched between the sheet-like member 30 and the other member to fix the wire-like transmission member 20 to the sheet-like member 30.

In this manner, when the base member 30 includes the metal layer 32, heat generated in the fixing region 26 in the wire-like transmission member 20 is transmitted to the metal layer 32 to extend to the whole metal layer 32 easily. Thus, heat accumulation in the fixing region 26 is further suppressed. Heat extending to the whole metal layer 32 is diffused easily.

Based on a premise of a configuration that the thermal conductive layer 25 is fixed to the sheet-like member 30, heat generated in the separating region 28 is transmitted to the metal layer 32 via the thermal conductive layer 25 to extend to the whole metal layer 32 easily. Thus, heat accumulation in the separating region 28 is further suppressed. Heat extending to the whole metal layer 32 is diffused easily.

When the wire-like transmission member 20 is fixed to the sheet-like member 30 via the adhesive agent 40, the adhesive agent 40 may be formed by a thermal conductive material having more favorable thermal conductivity than the covering 24. For example, the adhesive agent 40 described above may include a material exemplified as the thermal conductive filler F included in the thermal conductive layer 25. Accordingly, heat generated in the wire-like transmission member 20 is transmitted to the sheet-like member 30 more easily.

The adhesive agent 40 fixing the part of the wire-like transmission member 20 where the thermal conductive layer 25 is formed to the sheet-like member 30 may have more favorable thermal conductivity than the other part of the adhesive agent 40. For example, the adhesive agent 40 fixing the part of the wire-like transmission member 20 where the thermal conductive layer 25 is formed to the sheet-like member 30 may include more thermal conductive filler than the other part, or may include a thermal conductive filler having more favorable thermal conductivity.

Heat generated in the fixing region 26 is transmitted to the sheet-like member 30 via the adhesive agent 40 in almost the whole fixing region 26. In the meanwhile, heat generated in the separating region 28 is transmitted to the sheet-like member 30 via the thermal conductive layer 25, thus there is a possibility that more heat is concentrated in the part of the adhesive agent 40 fixing the thermal conductive layer 25 to the sheet-like member 30. The thermal conductivity of the part of the adhesive agent 40 fixing the thermal conductive layer 25 to the sheet-like member 30 is made favorable, thus heat in the separating region 28 is effectively transmitted to the sheet-like member 30 and heat accumulation in the separating region 28 can be suppressed more effectively. The other part of the adhesive agent 40 needs not have favorable thermal conductivity compared with the part of the adhesive agent 40 fixing the thermal conductive layer 25 to the sheet-like member 30, thus cost reduction can be achieved.

It is also applicable that only the part of the adhesive agent 40 fixing the part where the thermal conductive layer 25 is formed to the sheet-like member 30 include a thermal conductive filler to have more favorable thermal conductivity than the covering 24.

Each configuration described in the embodiment and each modification example can be appropriately combined as long as they are not contradictory.

EXPLANATION OF REFERENCE SIGNS 10 wiring member
20 wire-like transmission member
22 transmission wire body
24 covering
25 thermal conductive layer
25B thermal conductive layer
26 fixing region
28 separating region
30 base member (sheet-like member)
32 metal layer
40 adhesive agent
50 connector
F thermal conductive filler

The invention claimed is:
1. A wiring member, comprising:
a base member; and
a wire-like transmission member having a transmission wire body and a covering provided around the transmission wire body, wherein
the wire-like transmission member includes a fixing region fixed to the base member and a separating region separated from the base member, wherein the base member is provided to a longitudinal side of the wire-like transmission member so as not to surround the wire-like transmission member, and a thermal conductive layer having more favorable thermal conductivity than the covering is formed on an outer periphery of the covering in the separating region.

2. The wiring member according to claim 1, wherein the thermal conductive layer is formed in a region reaching the base member from the separating region.

3. The wiring member according to claim 1, wherein the thermal conductive layer is a resin layer including a thermal conductive filler or a metal layer.

4. The wiring member according to claim 1, wherein the base member includes a metal layer.

5. The wiring member according to claim 1, wherein the wire-like transmission member is fixed to the base member by a thermal conductive material having more favorable thermal conductivity than the covering in the fixing region.

6. The wiring member according to claim 1, wherein the base member is a planar sheet.

7. A wiring member, comprising:

a base member; and a wire-like transmission member having a transmission wire body and a covering provided around the transmission wire body, wherein the wire-like transmission member includes a fixing region fixed to the base member and a separating region separated from the base member, and a thermal conductive layer having more favorable thermal conductivity than the covering is formed on an outer periphery of the covering in the separating region, wherein the thermal conductive layer is formed in an area except for at least a part of an outer periphery of the covering in the fixing region.

8. A wiring member, comprising:

a base member; and a wire-like transmission member having a transmission wire body and a covering provided around the transmission wire body, wherein the wire-like transmission member includes a fixing region fixed to the base member and a separating region separated from the base member, and a thermal conductive layer having more favorable thermal conductivity than the covering is formed on an outer periphery of the covering in the separating region, wherein the wire-like transmission member and the base member are fixed via an adhesive agent that is different from the thermal conductive layer.

* * * * *